United States Patent
Utsunomiya et al.

(10) Patent No.: US 9,276,799 B2
(45) Date of Patent: Mar. 1, 2016

(54) WIRELESS TRANSMISSION APPARATUS AND DISTORTION COMPENSATION METHOD

(71) Applicant: FUJITSU LIMITED, Kawasaki-shi, Kanagawa (JP)

(72) Inventors: Yuichi Utsunomiya, Kawasaki (JP); Hiroyoshi Ishikawa, Kawasaki (JP); Kazuo Nagatani, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/672,945

(22) Filed: Mar. 30, 2015

(65) Prior Publication Data

US 2015/0304154 A1 Oct. 22, 2015

(30) Foreign Application Priority Data

Apr. 18, 2014 (JP) .................. 2014-086770

(51) Int. Cl.
*H04L 27/36* (2006.01)
*H03F 1/32* (2006.01)
*H03F 3/21* (2006.01)

(52) U.S. Cl.
CPC ............ *H04L 27/368* (2013.01); *H03F 1/3247* (2013.01); *H03F 3/21* (2013.01); *H03F 2201/3215* (2013.01)

(58) Field of Classification Search
CPC ............ H03F 1/3247; H03F 2200/451; H03F 2201/3233; H03F 3/189; H03F 3/24; H03F 2201/3212; H03F 3/21; H03F 2201/3215; H04B 1/0475; H04B 1/0017; H04B 2001/0425; H04B 2001/045; H04L 25/03343; H04L 27/368
USPC .......................................... 375/295, 296, 297
See application file for complete search history.

(56) References Cited

U.S. PATENT DOCUMENTS

| | | | |
|---|---|---|---|
| 6,954,621 | B2 * | 10/2005 | Bauernschmitt et al. ..... 455/126 |
| 2002/0154620 | A1 | 10/2002 | Azenkot et al. |
| 2006/0276147 | A1 | 12/2006 | Suzuki et al. |
| 2011/0026509 | A1 | 2/2011 | Tanaka |
| 2012/0098596 | A1 | 4/2012 | Nagatani et al. |

FOREIGN PATENT DOCUMENTS

| | | |
|---|---|---|
| JP | 2002-359583 | 12/2002 |
| JP | 2003-8360 | 1/2003 |
| JP | 2007-20157 | 1/2007 |
| JP | 2012-060254 | 3/2012 |
| JP | 2012-090158 | 5/2012 |
| WO | 2009131076 | 10/2009 |

* cited by examiner

*Primary Examiner* — Vineeta Panwalkar
(74) *Attorney, Agent, or Firm* — Fujitsu Patent Center

(57) ABSTRACT

A wireless transmission apparatus includes an amplifier that amplifies power of a multicarrier signal, a first frequency shift unit that performs a first frequency shift on a first signal fed back from the amplifier on the basis of carrier frequencies of the multicarrier signal to output a second signal after the first frequency shift, a band limiting unit that performs frequency band limitation on the second signal to output a third signal after the frequency band limitation, and a distortion compensation device that compensates nonlinear distortion of the amplifier on the basis of the third signal.

5 Claims, 6 Drawing Sheets

WIRELESS TRANSMISSION APPARATUS AND DISTORTION COMPENSATION METHOD

CROSS-REFERENCE TO RELATED APPLICATION

This application is based upon and claims the benefit of priority of the prior Japanese Patent Application No. 2014-086770, filed on Apr. 18, 2014, the entire contents of which are incorporated herein by reference.

FIELD

The embodiments discussed herein are related to a wireless transmission apparatus and a distortion compensation method.

BACKGROUND

A wireless transmission apparatus in a wireless communication system includes an amplifier (Power Amplifier; hereinafter, sometimes referred to as "PA") that amplifies power of a transmission signal. The wireless transmission apparatus typically operates the PA near the saturation region of the PA to enhance the power efficiency of the PA. However, operating the PA near the saturation region increases nonlinear distortion. To suppress the nonlinear distortion to reduce adjacent channel leakage power (ACLR: Adjacent Channel Leakage Ratio), the wireless transmission apparatus includes a distortion compensation device for compensating the nonlinear distortion.

One of the distortion compensation systems used for the distortion compensation device is a "pre-distortion system." Hereinafter, "pre-distortion" may be referred to as "PD." The distortion compensation device of the PD system previously multiplies a transmission baseband signal yet to be inputted to the PA by a distortion compensation factor having an inverse characteristic to the nonlinear distortion of the PA. The distortion compensation device of the PD system thereby improves the linearity of the output of the PA to suppress the distortion of the output of the PA. The transmission baseband signal multiplied by the distortion compensation factor may be referred to as a "pre-distortion signal (PD signal)." The resulting PD signal is a signal previously distorted according to the inverse characteristic of the nonlinear distortion of the PA before input to the PA.

For example, some distortion compensation devices of the PD system have a table containing a plurality of distortion compensation factors, and read a distortion compensation factor according to the power of the transmission baseband signal from the table. The distortion compensation factors stored in the table are successively updated so that an error between the transmission baseband signal serving as a reference signal and the signal that is outputted and fed back from the PA (hereinafter, sometimes referred to as a "feedback signal") is minimized.

For example, some conventional power amplification systems including a distortion compensation device of the PD system limit the frequency band of the feedback signal when updating the distortion compensation factors. In such power amplification systems, the pass bandwidth of the feedback signal is changed by a band-limiting filter. If the passband has a predetermined narrowness, predetermined low-order distortions are compensated. If the passband has a predetermined width, predetermined high-order distortions are compensated.

Related-art examples are described, for example, in Japanese Laid-open Patent Publication No. 2012-090158, in Japanese Laid-open Patent Publication No. 2012-060254, in Japanese Laid-open Patent Publication No. 2003-008360, in Japanese Laid-open Patent Publication No. 2002-359583, in Japanese Laid-open Patent Publication No. 2007-020157, and in International Publication Pamphlet No. WO 2009/131076.

FIG. 1 is a diagram for explaining a problem. Suppose that the transmission baseband signal is a multicarrier signal including a plurality of signals having respective different carrier frequencies. If the multicarrier signal is subjected to a PA operating in a nonlinear region, inter modulation distortions (hereinafter, sometimes referred to as "IMs") can occur. That is, if the transmission baseband signal is a multicarrier signal, the feedback signal can include IMs. For example, as illustrated in FIG. 1, if a multicarrier signal including a signal having a carrier frequency f1 and a signal having a carrier frequency f2 is amplified in a nonlinear region, the feedback signal may include IM3s, IM5s, and IM7s which are the third-, fifth-, and seventh-order IMs, respectively. As illustrated in FIG. 1, the IMs occur at the skirts on both sides of the carrier frequencies f1 and f2 and in locations at certain distances from the carrier frequencies f1 and f2 on the frequency axis. Suppose that the distortion compensation device can compensate up to IM7s. In other words, the frequency band capable of distortion compensation (hereinafter, sometimes referred to as a "distortion compensation band") covers up to IM7s.

The IM3s, IM5s, and IM7s occurring in locations at certain distances from the carrier frequencies f1 and f2 occur in a symmetrical manner on the frequency axis with respect to a center frequency f0 of the multicarrier signal. The center frequency f0 of the multicarrier signal including the signal having the carrier frequency f1 and the signal having the carrier frequency f2 is given by "f0=(f1+f2)/2."

Conventionally, the frequency band limitation on the feedback signal is performed by using a frequency range of ±fc symmetrical on the frequency axis with respect to a predetermined reference frequency fs as the passband. More specifically, the filter used for the frequency band limitation has cutoff frequencies of "fs+fc" and "fs−fc." FIG. 1 illustrates the frequency characteristic of the filter. The reference frequency fs is typically 0 Hz.

The center frequency f0 of the multicarrier signal usually coincides with the reference frequency fs. However, in specific cases, as illustrated in FIG. 1, the center frequency f0 of the multicarrier signal can deviate from the reference frequency fs. If the center frequency f0 of the multicarrier signal deviates from the reference frequency fs, the center frequency f0 of the feedback signal also deviates from the reference frequency fs. If the center frequency f0 of the multicarrier signal deviates from the reference frequency fs, the IMs become asymmetrical on the frequency axis with respect to the reference frequency fs.

Examples of the specific cases include when a communication system is being switched from an old one to a new one and the center frequency f0 of the old system which has been coincident with the reference frequency fs is temporarily changed. When switching from an old system to a new system, the old and new systems can be temporarily made to coexist and placed in operation instead of completely stopping the old one before starting the operation of the new one. In such a case, for example, the center frequency f0 of the new system is shifted by −Δf from the center frequency f0 of the old system.

In another example of the specific cases, respective different carrier patterns may be assigned to a first area and a second area. In such a case, for example, the center frequency f0 in the second area is shifted by $-\Delta f$ from the center frequency f0 in the first area. As a result, the center frequency f0 which coincides with the reference frequency fs in the first area is $-\Delta f$ different from the reference frequency fs in the second area.

If the IMs are asymmetrical on the frequency axis with respect to the reference frequency fs, the IMs lying in the passband below the reference frequency fs can be different from those in the passband at and above the reference frequency f. As a result, IMs can be extracted asymmetrically on the frequency axis with respect to the reference frequency fs. In the example illustrated in FIG. 1, the passband below the reference frequency fs includes only the IM3 among the IMs occurring in locations at certain distances from the carrier frequencies f1 and f2. The passband at and above the reference frequency fs includes the IM3 and IM5. In other words, among the IMs occurring in locations at certain distances from the carrier frequencies f1 and f2, the IM5 and IM7 below the reference frequency fs are cut off by the frequency band limitation. In contrast, only the IM7 is cut off at or above the reference frequency fs. That is, suppose that the conventional frequency band limitation is performed on the feedback signal of which the center frequency f0 deviates from the reference frequency fs. In such a case, the feedback signal after the frequency band limitation includes IMs asymmetrical between the range below the center frequency f0 and the range at and above the center frequency f0. In other words, among the IMs included in the feedback signal, the frequency band-limited IMs are asymmetrical on the frequency axis. If the distortion compensation of the PD system is performed by using such a feedback signal including asymmetrical IMs, the accuracy of the distortion compensation decreases due to the asymmetry of the IMs.

The foregoing conventional power amplification systems have not taken into account the problem of a decrease in the distortion compensation accuracy due to the deviation of the center frequency f0 of the multicarrier signal from the reference frequency fs.

SUMMARY

According to an aspect of an embodiment, a wireless transmission apparatus includes an amplifier that amplifies power of a multicarrier signal, a first frequency shift unit that performs a first frequency shift on a first signal fed back from the amplifier on the basis of carrier frequencies of the multicarrier signal to output a second signal after the first frequency shift, a band limiting unit that performs frequency band limitation on the second signal to output a third signal after the frequency band limitation, and a distortion compensation device that compensates nonlinear distortion of the amplifier on the basis of the third signal.

According to another aspect of an embodiment, a wireless transmission apparatus includes an amplifier that amplifies power of a multicarrier signal, a band limiting unit that performs frequency band limitation on a first signal fed back from the amplifier to output a second signal after the frequency band limitation, a distortion compensation device that compensates nonlinear distortion of the amplifier on the basis of the second signal, and a determination unit that determines a passband of the frequency band limitation in the band limiting unit on the basis of carrier frequencies of the multicarrier signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
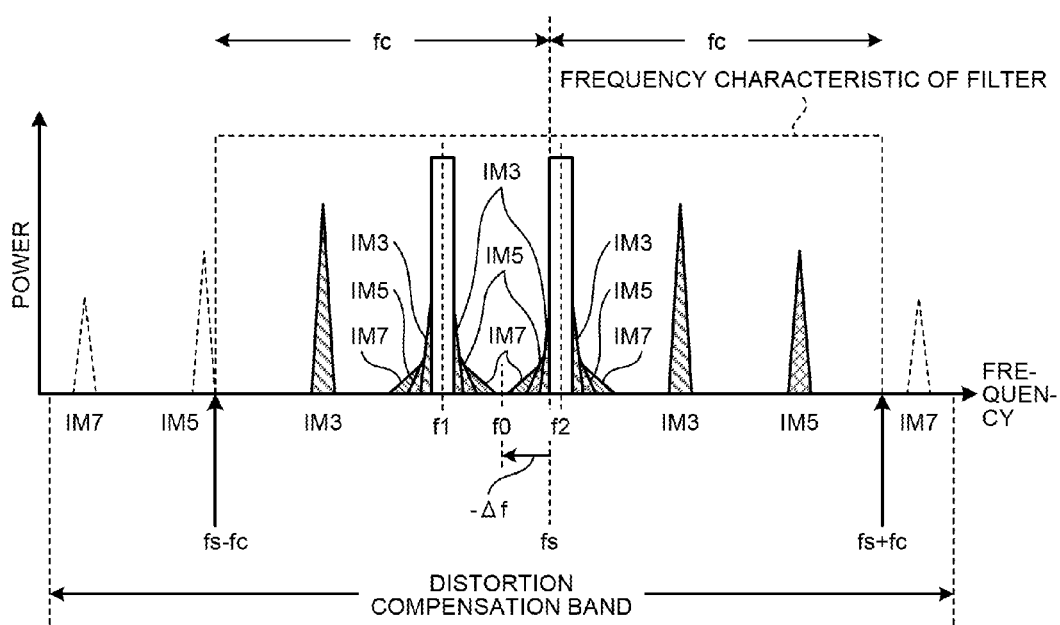
FIG. 1 is a diagram for explaining a problem.

Preferred Embodiments of the Present Invention will be explained with reference to accompanying drawings. In the embodiments, components having the same functions are designated by the same reference numerals. A redundant description thereof will be omitted.

[a] First Embodiment

Configuration Example of Wireless Transmission Apparatus

Figure 2:
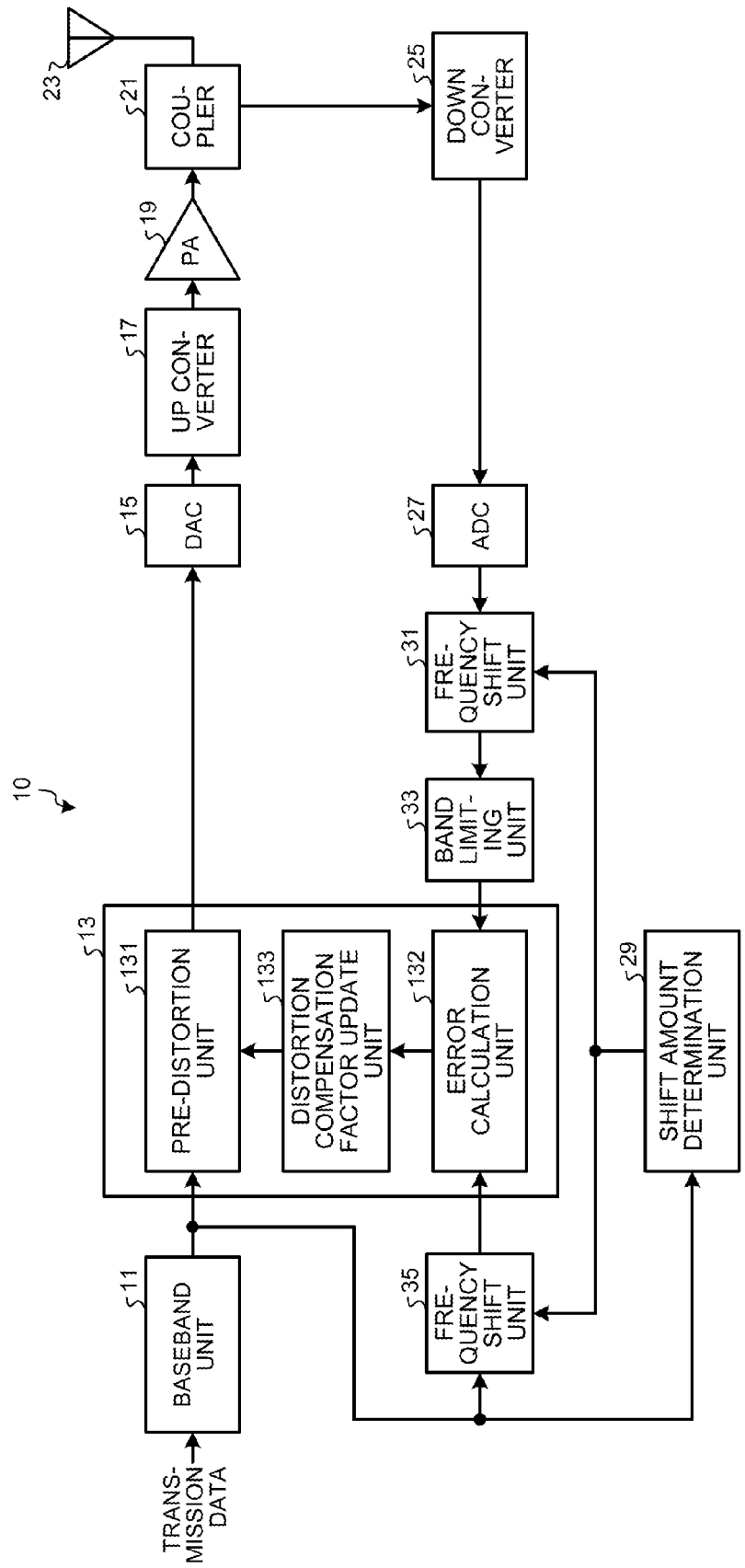
FIG. 2 is a block diagram illustrating a configuration example of a wireless transmission apparatus according to a first embodiment.

FIG. 2 is a block diagram illustrating a configuration example of a wireless transmission apparatus according to a first embodiment. In FIG. 2, a wireless transmission apparatus 10 includes a baseband unit 11, a distortion compensation device 13, a DAC (Digital to Analog Converter) 15, an up converter 17, a PA 19, a coupler 21, and an antenna 23. The wireless transmission apparatus 10 further includes a down converter 25, an ADC (Analog to Digital converter) 27, a shift amount determination unit 29, frequency shift units 31 and 35, and a band limiting unit 33.

The distortion compensation device 13 includes a pre-distortion unit (PD unit) 131, an error calculation unit 132, and a distortion compensation factor update unit 133. The distortion compensation device 13 is a distortion compensation device of the PD system.

For example, the wireless transmission apparatus 10 is mounted on a wireless communication terminal apparatus, a wireless communication base station apparatus, or the like used in a wireless communication system.

The baseband unit 11 performs baseband processing such as encoding processing and modulation processing on input transmission data to generate a transmission baseband signal. The baseband unit 11 outputs the generated transmission baseband signal to the PD unit 131, the frequency shift unit 35, and the shift amount determination unit 29. The baseband unit 11 here generates a multicarrier signal including a plurality of signals having respective different carrier frequencies as the transmission baseband signal.

The pre-distortion unit 131 multiplies the multicarrier signal by a distortion compensation factor successively updated by the distortion compensation factor update unit 133 to generate a PD signal. The pre-distortion unit 131 includes a table containing a plurality of distortion compensation factors. The pre-distortion unit 131 reads the distortion compensation factors according to power of the multicarrier signal from the table, and multiplies the multicarrier signal by the read distortion compensation factors. The distortion compensation factors stored in the table are successively updated by the distortion compensation factor update unit 133. The pre-distortion unit 131 outputs the generated PD signal to the DAC 15.

The DAC 15 converts the PD signal, a digital signal, into an analog signal and outputs the resultant to the up converter 17.

The up converter 17 up-converts the analog PD signal and outputs the up-converted PD signal to the PA 19.

The PA 19 amplifies the power of the up-converted PD signal and outputs the power-amplified signal to the coupler 21.

The coupler 21 distributes the power-amplified signal to the antenna 23 and the down converter 25. As a result, the signal outputted from the PA 19 is fed back to the distortion compensation device 13 via the down converter 25, the ADC 27, the frequency shift unit 31, and the band limiting unit 33.

The antenna 23 wirelessly transmits the power-amplified signal.

The down converter 25 down-converts the signal inputted from the coupler 21 and outputs the down-converted signal to the ADC 27.

The ADC 27 converts the down-converted signal, an analog signal, into a digital signal and outputs the converted digital signal to the frequency shift unit 31 as a feedback signal.

The shift amount determination unit 29 determines the amounts of shift and the shift directions of frequency shifts for the feedback signal and the multicarrier signal on the basis of the carrier frequencies of the multicarrier signal inputted from the baseband unit 11. The shift amount determination unit 29 outputs the determination results to the frequency shift units 31 and 35.

The frequency shift unit 31 shifts the frequency of the feedback signal inputted from the ADC 27 according to the amount of shift and the shift direction determined by the shift amount determination unit 29. The frequency shift unit 31 outputs the frequency-shifted feedback signal to the band limiting unit 33. That is, the frequency shift performed by the frequency shift unit 31 is based on the carrier frequencies of the multicarrier signal.

The band limiting unit 33 performs frequency band limitation on the frequency-shifted feedback signal and outputs the feedback signal after the frequency band limitation to the error calculation unit 132. For example, the band limiting unit 33 is implemented by a BPF (Band Pass Filter) that is a digital filter.

The frequency shift unit 35 shifts the frequency of the multicarrier signal inputted from the baseband unit 11 according to the amount of shift and the shift direction determined by the shift amount determination unit 29. The frequency shift unit 35 outputs the frequency-shifted multicarrier signal to the error calculation unit 132 as a reference signal. That is, the frequency shift performed by the frequency shift unit 35 is based on the carrier frequencies of the multicarrier signal.

The error calculation unit 132 calculates an error between the feedback signal after the frequency band limitation by the band limiting unit 33 and the reference signal inputted from the frequency shift unit 35. The error calculation unit 132 outputs the calculated error to the distortion compensation factor update unit 133.

The distortion compensation factor update unit 133 successively updates the distortion compensation factors stored in the table in the PD unit 131 by using a LMS (Least Mean Square) algorithm or the like so that the error calculated by the error calculation unit 132 is minimized.

Operation Example of Wireless Transmission Apparatus

Figure 3:
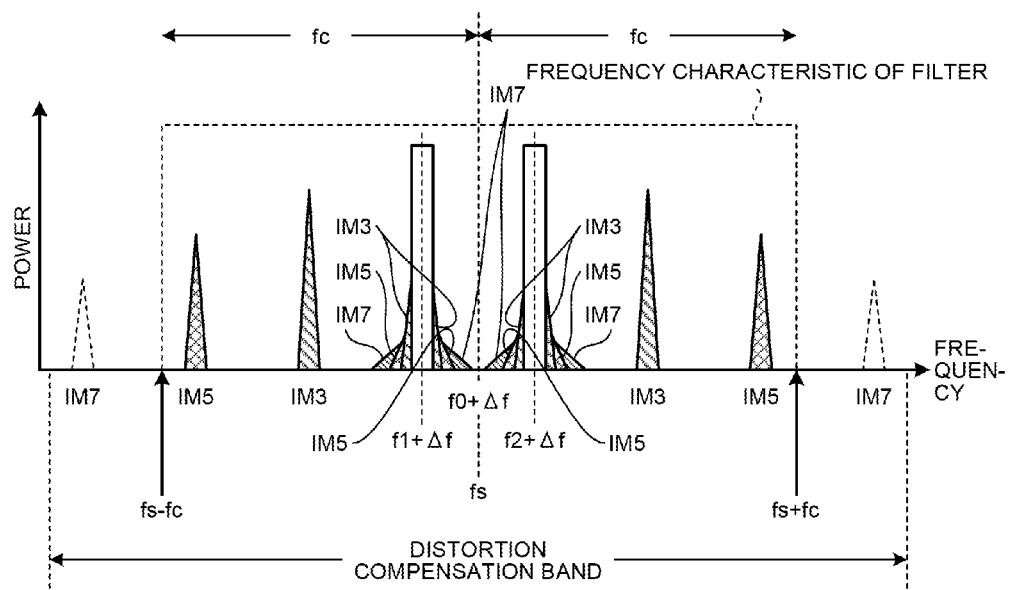
FIG. 3 is a diagram for explaining an operation of the wireless transmission apparatus according to the first embodiment.

An operation example of the wireless transmission apparatus 10 will be described below with reference to FIGS. 1 and 3. FIG. 3 is a diagram for explaining the operation of the wireless transmission apparatus according to the first embodiment.

The multicarrier signal generated by the baseband unit 11 includes, for example, as illustrated in FIG. 1, a signal having a carrier frequency f1 and a signal having a carrier frequency f2. The center frequency f0 of the multicarrier signal is $-\Delta f$ off a predetermined reference frequency fs. The feedback signal outputted from the ADC 27 therefore also has a center frequency f0 that is $-\Delta f$ off the predetermined reference frequency fs. As illustrated in FIG. 1, the feedback signal outputted from the ADC 27 includes the IM3s, IM5s, and IM7s. The reference frequency fs is typically 0 Hz.

In contrast, as illustrated in FIG. 3, the band limiting unit 33 performs the frequency band limitation on the feedback signal with reference to the reference frequency fs, by using a frequency range of ±fc symmetrical on the frequency axis as the passband. More specifically, the filter used for the frequency band limitation of the band limiting unit 33 has cutoff frequencies of "fs+fc" and "fs−fc." FIG. 3 illustrates the frequency characteristic of the filter.

The shift amount determination unit 29 then determines the amount of shift and the shift direction of the frequency shift for the feedback signal on the basis of the carrier frequencies of the multicarrier signal inputted from the baseband unit 11. For example, suppose that the multicarrier signal includes the signal having the carrier frequency f1 and the signal having the carrier frequency f2 as illustrated in FIG. 1. The shift amount determination unit 29 initially detects the carrier frequencies f1 and f2. The shift amount determination unit 29 then calculates the center frequency f0 of the multicarrier signal f0 on the basis of the detected carrier frequencies f1 and f2 according to the equation "f0=(f1+f2)/2." The reference frequency fs is known in advance to the shift amount determination unit 29. The shift amount determination unit 29 calculates a difference $\Delta f$ between the reference frequency fs and the center frequency f0 according to the equation "$\Delta f$=f0−fs." For example, if the multicarrier signal is the one illustrated in FIG. 1, the difference between the reference frequency fs and the center frequency f0 is calculated to be "$-\Delta f$." The shift amount determination unit 29 then determines the amount of shift and the shift direction of the frequency shift in the frequency shift unit 31 on the basis of the difference between the reference frequency fs and the center frequency f0. More specifically, the shift amount determination unit 29 determines the amount to shift to be "$\Delta f$" and the shift direction to be a direction opposite to the direction in which the center frequency f0 deviates from the reference frequency fs. In the example illustrated in FIG. 1, the direction of deviation is the negative direction, and the difference between the reference frequency fs and the center frequency f0 is calculated to be "$-\Delta f$." The shift amount determination unit 29 then determines the shift direction to be the positive direction. That is, the shift amount determination unit 29 determines the amount of shift and the shift direction of the frequency shift in the frequency shift unit 31 to be "$+\Delta f$." The shift amount determination unit 29 outputs the determination result "+Δf" to the frequency shift unit 31.

The frequency shift unit 31 shifts the frequency of the feedback signal according to the amount of shift and the shift direction determined by the shift amount determination unit 29. More specifically, as illustrated in FIG. 3, the frequency shift unit 31 shifts the feedback signal including the signals having the carrier frequencies f1 and f2 and the IM3s, IM5s, and IM7s by +Δf on the frequency axis. The center frequency f0 of the feedback signal is thereby shifted by +Δf to coincide with the reference frequency fs. As a result, as illustrated in FIG. 3, the IMs become symmetrical on the frequency axis with respect to the reference frequency fs. That is, the IMs in the passband fc below the reference frequency fs are the same as those in the passband fc at and above the reference frequency fs.

Consequently, the band limiting unit 33 extracts the IMs in a symmetrical manner on the frequency axis with respect to the reference frequency fs. For example, in FIG. 3, the IMs occur in positions at certain distances from the carrier frequencies f1 and f2. Of these, the IM7s at both ends of the distortion compensation band are cut off by the frequency band limitation of the band limiting unit 33 in both the ranges below the reference frequency fs and at and above the reference frequency fs. The center frequency f0 of the feedback signal is thus shifted by +Δf into f0+Δf. As a result, the feedback signal after the frequency band limitation by the band limiting unit 33 includes IMs symmetrical between the range below the center frequency and the range at and above the center frequency.

To maintain the accuracy of the error calculated by the error calculation unit 132, the feedback signal desirably has the same carrier pattern as that of the reference signal. The shift amount determination unit 29 then determines the amount of shift and the shift direction of the frequency shift in the frequency shift unit 35 to be "Δf," the same as those of the frequency shift in the frequency shift unit 31. The shift amount determination unit 29 outputs the determination result "+Δf" to the frequency shift unit 35.

The frequency shift unit 35 shifts the frequency of the multicarrier signal according to the amount of shift and the shift direction determined by the shift amount determination unit 29. More specifically, as illustrated in FIG. 3, the frequency shift unit 35 shifts the multicarrier signal including the signals having the carrier frequencies f1 and f2 by +Δf on the frequency axis. The center frequency of the multicarrier signal is thereby shifted by the same amount and in the same direction as the center frequency of the feedback signal is. As a result, the carrier pattern of the feedback signal that is outputted from the band limiting unit 33 and inputted to the error calculation unit 132 coincides with that of the reference signal that is outputted from the frequency shift unit 35 and inputted to the error calculation unit 132.

The error calculation unit 132 calculates the error between the feedback signal after the frequency band limitation by the band limiting unit 33 and the reference signal inputted from the frequency shift unit 35. The error calculation unit 132 outputs the calculated error to the distortion compensation factor update unit 133.

The distortion compensation factor update unit 133 successively updates the distortion compensation factors stored in the table in the PD unit 131 by using the LMS algorithm or the like so that the error calculated by the error calculation unit 132 is minimized.

As described above, according to the first embodiment, the wireless transmission apparatus 10 includes the PA 19, the frequency shift unit 31, the band limiting unit 33, and the distortion compensation device 13. The PA 19 amplifies the power of the multicarrier signal. The frequency shift unit 31 shifts the frequency of the feedback signal from the PA 19 according to the carrier frequencies of the multicarrier signal, and outputs the frequency-shifted feedback signal to the band limiting unit 33. The band limiting unit 33 performs the frequency band limitation on the frequency-shifted feedback signal, and outputs the feedback signal after the frequency band limitation to the distortion compensation device 13. The distortion compensation device 13 compensates nonlinear distortion of the PA 19 on the basis of the feedback signal after the frequency band limitation.

In such a manner, the nonlinear distortion of the PA 19 can be compensated on the basis of the feedback signal that includes IMs symmetrical on the frequency axis. This can prevent a decrease in the distortion compensation accuracy even if the center frequency of the multicarrier signal deviates from the reference frequency.

In the first embodiment, the band limiting unit 33 performs the frequency band limitation by using the frequency range symmetrical with respect to the predetermined reference frequency fs as the passband. The wireless transmission apparatus 10 further includes the shift amount determination unit 29. The shift amount determination unit 29 calculates the center frequency f0 of the multicarrier signal on the basis of the carrier frequencies of the multicarrier signal. The shift amount determination unit 29 determines the amount of shift and the shift direction of the frequency shift in the frequency shift unit 31 on the basis of the difference between the reference frequency fs and the center frequency f0.

In such a manner, the IMs subjected to the frequency band limitation among the IMs included in the feedback signal can be reliably made symmetrical on the frequency axis.

In the first embodiment, the wireless transmission apparatus 10 further includes the frequency shift unit 35. The frequency shift unit 35 shifts the frequency of the multicarrier signal inputted from the baseband unit 11 on the basis of the carrier frequencies of the multicarrier signal. The frequency shift unit 35 outputs the frequency-shifted multicarrier signal to the distortion compensation device 13 as the reference signal. The distortion compensation device 13 compensates the nonlinear distortion of the PA 19 on the basis of the feedback signal after the frequency band limitation and the frequency-shifted multicarrier signal. More specifically, in the distortion compensation device 13, the error calculation unit 132 calculates the error between the feedback signal after the frequency band limitation and the frequency-shifted multicarrier signal. The shift amount determination unit 29 determines the amount of shift and the shift direction of the frequency shift in the frequency shift unit 35 to be the same amount and the same direction as those of the frequency shift in the frequency shift unit 31.

In such a manner, the carrier pattern of the reference signal can be made to coincide with that of the feedback signal after the frequency band limitation. This can prevent the accuracy of the error from dropping due to the frequency shift of the feedback signal. That is, the accuracy of the calculated error can be maintained even if the frequency of the feedback signal is shifted.

[b] Second Embodiment

In the first embodiment, the frequency of the digital feedback signal is shifted. A second embodiment differs from the first embodiment in that the frequency of an analog signal is shifted.

Configuration Example of Wireless Transmission Apparatus

Figure 4:
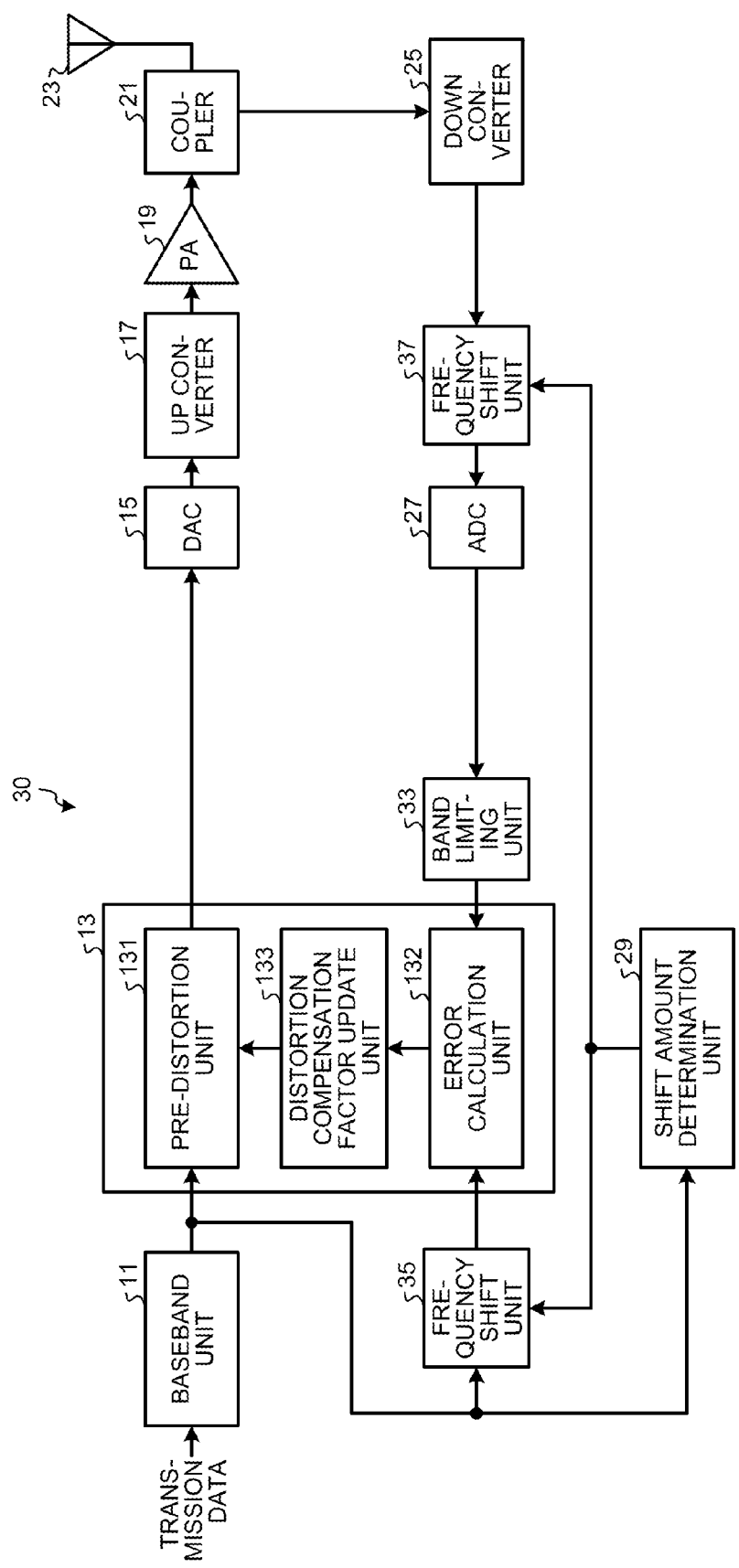
FIG. 4 is a block diagram illustrating a configuration example of a wireless transmission apparatus according to a second embodiment.

FIG. 4 is a block diagram illustrating a configuration example of a wireless transmission apparatus according to the second embodiment. In FIG. 4, a wireless transmission apparatus 30 includes a frequency shift unit 37 instead of the frequency shift unit 31 illustrated in FIG. 2 (the first embodiment).

The down converter 25 down-converts the signal inputted from the coupler 21 and outputs the down-converted signal to the frequency shift unit 37.

The shift amount determination unit 29 determines the amounts of shift and the shift directions for the feedback signal and the multicarrier signal on the basis of the carrier frequencies of the multicarrier signal inputted from the baseband unit 11. The shift amount determination unit 29 outputs the determination results to the frequency shift units 37 and 35.

The frequency shift unit 37 shifts the frequency of the analog signal inputted from the down converter 25 according to the amount of shift and the shift direction determined by the shift amount determination unit 29. The frequency shift unit 37 outputs the frequency-shifted signal to the ADC 27. Details of the frequency shift in the frequency shift unit 37 are similar to those of the frequency shift in the frequency shift unit 31 according to the first embodiment. A description thereof will thus be omitted.

The ADC 27 converts the frequency-shifted analog signal into a digital signal and outputs the converted digital signal to the band limiting unit 33 as the feedback signal.

In such a manner, like the first embodiment, the nonlinear distortion of the PA 19 can be compensated on the basis of the feedback signal including IMs symmetrical on the frequency axis. The distortion compensation accuracy can thus be prevented from dropping even if the center frequency of the multicarrier signal deviates from the reference frequency.

The function of the frequency shift unit 37 may be incorporated into the down converter 25 so that the down converter 25 performs the down conversion and the frequency shift at the same time.

[c] Third Embodiment

In the first embodiment, the frequency of the feedback signal is shifted according to the passband of the band limiting unit. A third embodiment differs from the first embodiment in that the passband of the band limiting unit is controlled according to the carrier pattern of the feedback signal.

Configuration Example of Wireless Transmission Apparatus

Figure 5:
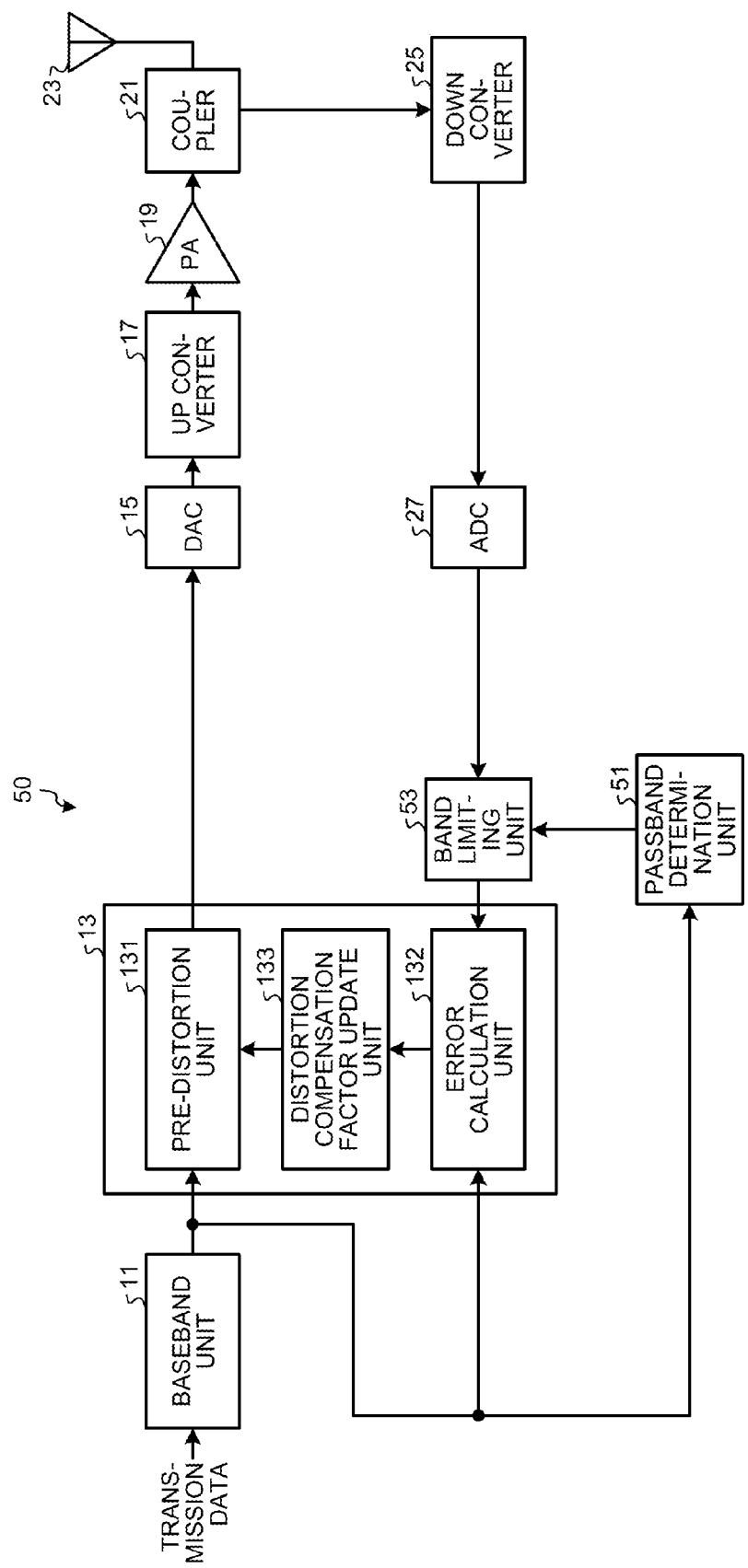
FIG. 5 is a block diagram illustrating a configuration example of a wireless transmission apparatus according to a third embodiment.

FIG. 5 is a block diagram illustrating a configuration example of a wireless transmission apparatus according to the third embodiment. In FIG. 5, a wireless transmission apparatus 50 includes a passband determination unit 51 and a band limiting unit 53 instead of the shift amount determination unit 29, the frequency shift units 31 and 35, and the band limiting unit 33 illustrated in FIG. 2 (the first embodiment).

The baseband unit 11 outputs the generated multicarrier signal to the PD unit 131 and the passband determination unit 51. The baseband unit 11 also outputs the generated multicarrier signal to the error calculation unit 132 as the reference signal.

The error calculation unit 132 calculates a difference between the feedback signal after the frequency band limitation by the band limiting unit 53 and the reference signal inputted from the baseband unit 11. The error calculation unit 132 outputs the calculated error to the distortion compensation factor update unit 133.

The passband determination unit 51 determines the passband of the frequency band limitation in the band limiting unit 53 on the basis of the carrier frequencies of the multicarrier signal inputted from the baseband unit 11. The passband determination unit 51 outputs the determination result to the band limiting unit 53.

The band limiting unit 53 performs the frequency band limitation on the feedback signal inputted from the ADC 27, and outputs the feedback signal after the frequency band limitation to the error calculation unit 132. The band limiting unit 53 performs the frequency band limitation on the feedback signal inputted from the ADC 27 according to the passband determined by the passband determination unit 51. For example, the band limiting unit 53 is implemented by a BPF that is a digital filter having a variable passband.

The error calculation unit 132 calculates the error between the feedback signal after the frequency band limitation by the band limiting unit 53 and the reference signal inputted from the baseband unit 11. The error calculation unit 132 outputs the calculated error to the distortion compensation factor update unit 133.

Operation Example of Wireless Transmission Apparatus

Figure 6:
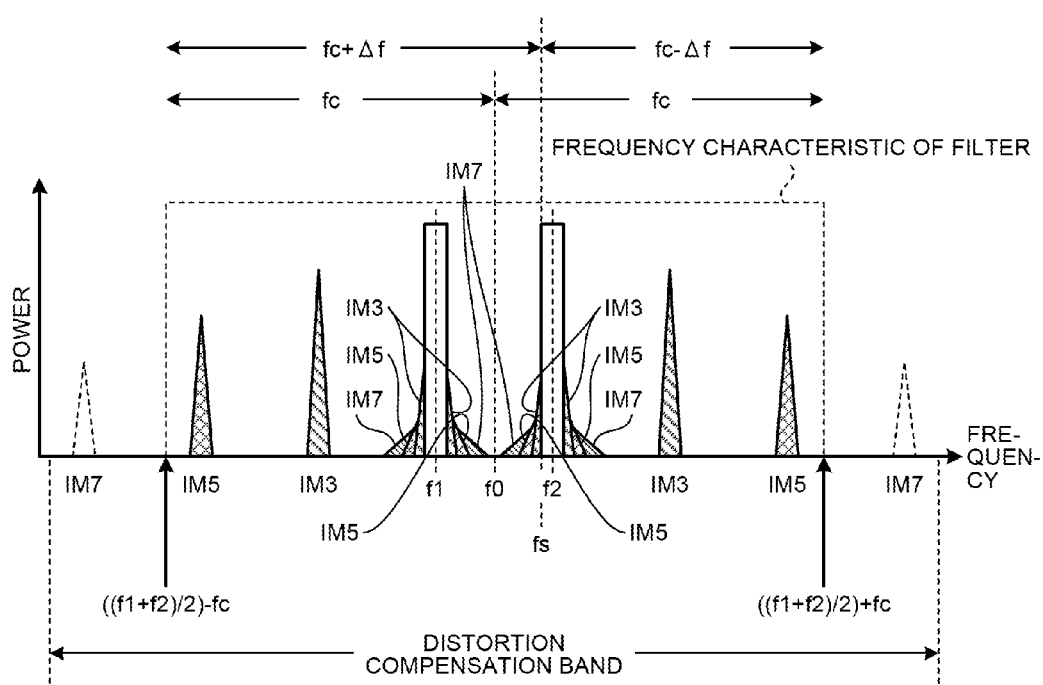
FIG. 6 is a diagram for explaining an operation of the wireless transmission apparatus according to the third embodiment.

An operation example of the wireless transmission apparatus 50 will be described below with reference to FIGS. 1 and 6. FIG. 6 is a diagram for explaining the operation of the wireless transmission apparatus according to the third embodiment.

The multicarrier signal generated by the baseband unit 11 includes, for example, as illustrated in FIG. 1, the signal having the carrier frequency f1 and the signal having the carrier frequency f2. The center frequency f0 of the multicarrier signal is $-\Delta f$ off the predetermined frequency fs. The feedback signal outputted from the ADC 27 therefore also has a center frequency f0 that is $-\Delta f$ off the predetermined reference frequency fs. As illustrated in FIG. 1, the feedback signal outputted from the ADC 27 includes the IM3s, IM5s, and IM7s. The reference frequency fs is typically 0 Hz.

The passband determination unit 51 then determines the passband of the frequency band limitation in the band limiting unit 53 on the basis of the carrier frequencies of the multicarrier signal inputted from the baseband unit 11. For example, suppose that the multicarrier signal includes the signal having the carrier frequency f1 and the signal having the carrier frequency f2 as illustrated in FIG. 1. The passband determination unit 51 initially detects the carrier frequencies f1 and f2. The passband determination unit 51 then calculates the center frequency f0 of the multicarrier signal on the basis of the detected carrier frequencies f1 and f2 according to the equation "f0=(f1+f2)/2." The passband determination unit 51 determines the cutoff frequencies of the filter used for the frequency band limitation in the band limiting unit 53 to be "f0+fc" and "f0−fc" with reference to the center frequency f0 of the multicarrier signal. In other words, the passband determination unit 51 determines the cutoff frequencies of the filter used for the frequency band limitation in the band limiting unit 53 to be "((f1+f2)/2)+fc" and "((f1+f2)/2)−fc." The resulting passband of the filter used for the frequency band limitation in the band limiting unit 53 is the frequency range of ±fc that is symmetrical on the frequency axis with respect to the center frequency f0. FIG. 6 illustrates the frequency characteristic of the filter. That is, the passband determination unit 51 determines the frequency range symmetrical on the frequency axis with respect to the center frequency f0 of the multicarrier signal to be the passband of the band limiting unit 53. The passband determination unit 51 then outputs the determined cutoff frequencies "((f1+f2)/2)+fc" and "((f1+f2)/2)−fc" to the band limiting unit 53.

In other words, with reference to the reference frequency fs which is known in advance to the passband determination unit 51, the passband in the range below the reference frequency fs is "fc+Δf" and the passband in the range at and above the reference frequency fs is "fc−Δf." That is, the passband determination unit 51 determines a frequency range asymmetrical on the frequency axis with respect to the reference frequency fs to be the passband of the band limiting unit 53. Consequently, as illustrated in FIG. 6, the IMs falling within the passband "fc+Δf" below the reference frequency fs coincide with those falling within the passband "fc−Δf" at and above the reference frequency fs.

The band limiting unit 53 performs the frequency band limitation on the feedback signal inputted from the ADC 27 according to the cutoff frequencies inputted from the passband determination unit 51. More specifically, the band limiting unit 53 performs the frequency band limitation on the feedback signal by setting the passband of the filter to the frequency range of f0±fc with the center frequency f0 at the center.

The band limiting unit 53 thus extracts the IMs in a symmetrical manner on the frequency axis with respect to the center frequency f0. For example, in FIG. 6, the IMs occur in positions at certain distances from the carrier frequencies f1 and f2. Of these, the IM7s at both ends of the distortion compensation band are cut off by the frequency band limitation of the band limiting unit 53 in both the ranges below the center frequency f0 and at and above the center frequency f0. The passband of the band limiting unit 53 is thus set to be a frequency range asymmetrical on the frequency axis with respect to the reference frequency fs. As a result, the feedback signal after the frequency band limitation by the band limiting unit 53 includes IMs symmetrical between the range below the center frequency and the range at and above the center frequency.

The error calculation unit 132 calculates the error between the feedback signal after the frequency band limitation by the band limiting unit 53 and the reference signal inputted from the baseband unit 11. The error calculation unit 132 outputs the calculated error to the distortion compensation factor update unit 133.

The distortion compensation factor update unit 133 successively updates the distortion compensation factors stored in the table in the PD unit 131 by using the LMS algorithm or the like so that the error calculated by the error calculation unit 132 is minimized.

As described above, according to the third embodiment, the wireless transmission apparatus 50 includes the PA 19, the band limiting unit 53, the distortion compensation device 13, and the passband determination unit 51. The PA 19 amplifies the power of the multicarrier signal. The band limiting unit 53 performs the frequency band limitation on the feedback signal from the PA 19, and outputs the feedback signal after the frequency band limitation to the distortion compensation device 13. The distortion compensation device 13 compensates the nonlinear distortion of the PA 19 on the basis of the feedback signal after the frequency band limitation. The passband determination unit 51 determines the passband of the frequency band limitation in the band limiting unit 53 on the basis of the carrier frequencies of the multicarrier signal.

In such a manner, like the first embodiment, the nonlinear distortion of the PA 19 can be compensated on the basis of the feedback signal that includes the IMs symmetrical on the frequency axis. This can prevent a decrease in the distortion compensation accuracy even if the center frequency of the multicarrier signal deviates from the reference frequency.

In the third embodiment, the passband determination unit 51 calculates the center frequency f0 of the multicarrier signal on the basis of the carrier frequencies of the multicarrier signal. The passband determination unit 51 then determines a frequency range symmetrical with respect to the center frequency f0 to be the passband of the frequency band limitation in the band limiting unit 53.

In such a manner, like the first embodiment, the IMs subjected to the frequency band limitation among the IMs included in the feedback signal can be reliably made symmetrical on the frequency axis.

The filter for implementing the band limiting unit 53 may be a BPF having a variable passband, or a LPF (Low Pass Filter) and a HPF (High Pass Filter) connected in cascade. To make the passband variable, the band limiting unit 53 may include a plurality of BPFs having respective different passbands.

The first to the third embodiments have been described above.

[d] Other Embodiments

The distortion compensation device 13 is implemented in hardware by an FPGA (Field Programmable Gate Array), an LSI (Large Scale Integrated circuit), a processor, or the like. The baseband unit 11, the shift amount determination unit 29, the frequency shift units 31, 35, and 37, and the passband determination unit 51 are also implemented in hardware by an FPGA, an LSI, a processor, or the like. Examples of the processor may include a CPU (Central Processing Unit) and a DSP (Digital Signal Processor). The DAC 15, the up converter 17, the PA 19, the coupler 21, the antenna 23, the down converter 25, and the ADC 27 are implemented in hardware by a wireless communication module. The wireless transmission apparatuses 10, 30, and 50, and the distortion compensation device 13 may include a memory. For example, the memory contains a table in which distortion compensation factors are stored.

According to the disclosed aspect, a decrease in the distortion compensation accuracy can be prevented.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless transmission apparatus comprising:
   an amplifier that amplifies power of a multicarrier signal;
   a determination unit that determines an amount of shift and a shift direction of a first frequency shift on the basis of a difference between a predetermined frequency and a center frequency of the multicarrier signal;
   a first frequency shift unit that performs the first frequency shift on a first signal fed back from the amplifier in accordance with the amount of shift and the shift direction determined by the determination unit to output a second signal after the first frequency shift;
   a band limiting unit that performs frequency band limitation on the second signal by using a frequency range symmetrical with respect to the predetermined frequency as a passband to output a third signal after the frequency band limitation; and a distortion compensation device that compensates nonlinear distortion of the amplifier on the basis of the third signal.

2. The wireless transmission apparatus according to claim 1, further comprising a second frequency shift unit that performs a second frequency shift on the multicarrier signal on the basis of carrier frequencies to output a fourth signal after the second frequency shift, wherein:
the distortion compensation device compensates the nonlinear distortion on the basis of the third signal and the fourth signal; and
the determination unit determines an amount of shift and a shift direction of the second frequency shift in the second frequency shift unit to be the same amount and the same direction as those of the first frequency shift in the first frequency shift unit.

3. A wireless transmission apparatus comprising:
an amplifier that amplifies power of a multicarrier signal;
a band limiting unit that performs frequency band limitation on a first signal fed back from the amplifier to output a second signal after the frequency band limitation;
a distortion compensation device that compensates nonlinear distortion of the amplifier on the basis of the second signal; and
a determination unit that determines a frequency range symmetrical with respect to a center frequency of the multicarrier signal as a passband of the frequency band limitation in the band limiting unit.

4. A distortion compensation method for compensating nonlinear distortion of an amplifier that amplifies power of a multicarrier signal, the distortion compensation method comprising:
determining an amount of shift and a shift direction in shifting a frequency of a signal fed back from the amplifier on the basis of a difference between a predetermined frequency and a center frequency of the multicarrier signal;
shifting the frequency of the signal fed back from the amplifier in accordance with the amount of shift and the shift direction determined in the determining;
performing frequency band limitation on the frequency-shifted signal by using a frequency range symmetrical with respect to the predetermined frequency as a passband; and
compensating the nonlinear distortion on the basis of the signal after the frequency band limitation.

5. A distortion compensation method for compensating nonlinear distortion of an amplifier that amplifies power of a multicarrier signal, the distortion compensation method comprising:
determining a frequency range symmetrical with respect to a center frequency of the multicarrier signal as a passband of a frequency band limitation; and
compensating the nonlinear distortion on the basis of the signal after the frequency band limitation.

* * * * *